United States Patent
Ha

(10) Patent No.: US 8,367,998 B2
(45) Date of Patent: Feb. 5, 2013

(54) IMAGE SENSOR HAVING A CHARGE PUMP CIRCUIT AND A DRIVE TRANSISTOR

(75) Inventor: Man Lyun Ha, Chungbuk (KR)

(73) Assignee: Dongbu HiTek Co., Ltd., Seoul (KR)

( * ) Notice: Subject to any disclaimer, the term of this patent is extended or adjusted under 35 U.S.C. 154(b) by 378 days.

(21) Appl. No.: 12/840,404

(22) Filed: Jul. 21, 2010

(65) Prior Publication Data

US 2011/0042551 A1 Feb. 24, 2011

(51) Int. Cl.
*H01L 27/00* (2006.01)
(52) U.S. Cl. .................. 250/208.1; 250/214 R
(58) Field of Classification Search .......... 250/208.1, 250/214 R, 214.1; 348/294–311, 241; 257/290–292
See application file for complete search history.

(56) References Cited

U.S. PATENT DOCUMENTS 6,624,850 B1 * 9/2003 Guidash .............. 348/308

* cited by examiner

*Primary Examiner* — Que T Le
(74) *Attorney, Agent, or Firm* — Sherr & Jiang, PLLC

(57) ABSTRACT

An image sensor includes a charge pump circuit supplying first to third signals having sequentially decreasing voltage levels, a reset transistor having a drain and a gate connected with the charge pump circuit to form a diode connection and receiving the first to third signals, a photodiode generating photocharges, a transfer transistor forming a series connection between the photodiode and the reset transistor, a floating diffusion region forming a parallel connection between the transfer transistor and the reset transistor and storing the photocharges, and a drive transistor connected with the floating diffusion region, the reset transistor, a power supply voltage terminal, and a unit pixel output terminal. A gate of the transfer transistor receives a turn-off voltage if the first or second signal is supplied, and receives a turn-off voltage or a turn-on voltage if the third signal is supplied.

20 Claims, 5 Drawing Sheets

IMAGE SENSOR HAVING A CHARGE PUMP CIRCUIT AND A DRIVE TRANSISTOR

The present application claims priority under 35 U.S.C. §119 to Korean Patent Application No. 10-2009-0077319, filed on Aug. 20, 2009, which is incorporated herein by reference in its entirety.

BACKGROUND

Generally, an image sensor is a semiconductor device that converts an optical image into electrical signals. The image sensor is classified into a Charge Coupled Device (CCD) image sensor, in which individual Metal Oxide Silicon (MOS) capacitors are located closely to each other such that charge carriers are stored in or discharged from the capacitors, and a CMOS image sensor employing a switching mode to sequentially detect an output by providing MOS transistors corresponding to the number of pixels through a CMOS technology that uses peripheral devices, such as a control circuit and a signal processing circuit.

A CMOS image sensor that converts information on an object into electrical signals includes signal processing chips having photodiodes, and an amplifier, an A/D converter, an internal voltage generator, a timing generator and a digital logic are combined in one chip. Accordingly, the CMOS image sensor is particularly advantageous in terms of space, power and cost reduction.

Hereinafter, details will be described regarding a circuit diagram showing the unit pixel of a 4T-type CMOS image sensor, which includes four transistors and one photodiode.

Figure 1:
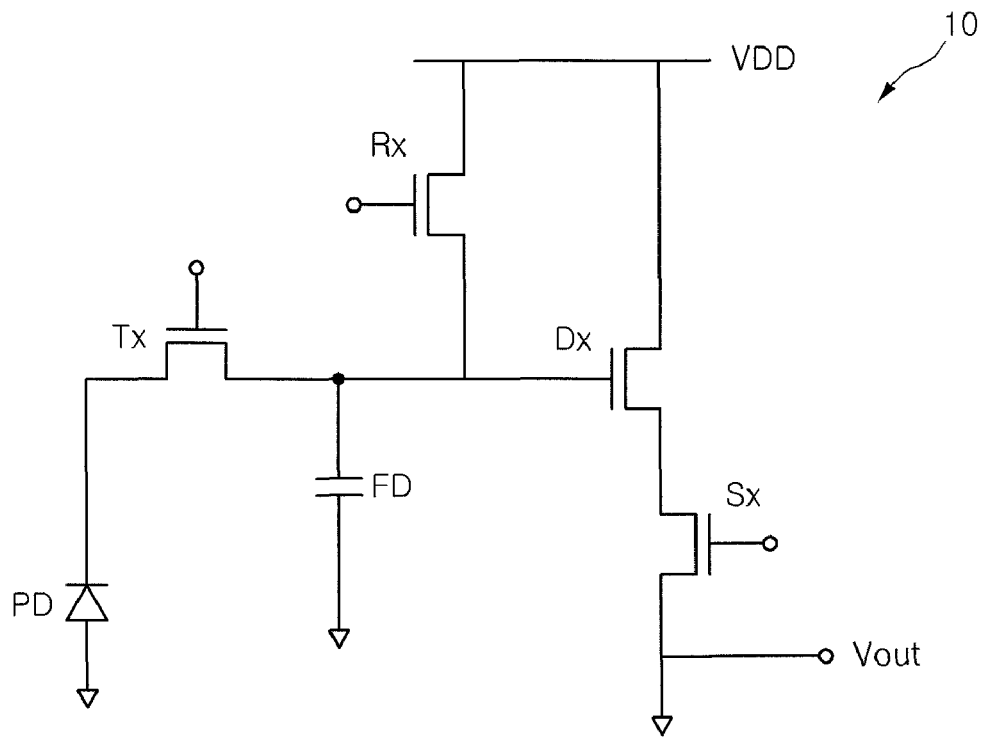

FIG. 1 is an equivalent circuit diagram showing a 4T-type CMOS image sensor. As illustrated in FIG. 1, unit pixel 10 of the 4T-type CMOS image sensor includes a floating diffusion node (FD) and a photodiode (PD) serving as a photoelectric conversion section and four transistors. The four transistors include a transfer transistor Tx, a reset transistor Rx, a drive transistor Dx, and a select transistor Sx.

SUMMARY

Embodiments relate to an image sensor which effectively controls the operation of a drive transistor by excluding a select transistor from the image sensor and expanding the function of a reset transistor.

In accordance with embodiments, the image sensor may include at least one of the following: a charge pump circuit which supplies control signals having various levels and acting as a terminal to drain charges of a floating diffusion region, a reset transistor connected with the charge pump circuit to form a diode connection and receiving the control signal to control a drive transistor, a transfer transistor which receives an additional gate signal from an external device to control the drive transistor together with the reset transistor, and the drive transistor connected with the floating diffusion region, the reset transistor, a power supply voltage terminal, and a unit pixel output terminal to output a reset signal or a signal.

DRAWINGS

FIG. 1 is an equivalent circuit diagram representing a 4T-type CMOS image sensor.

Figure 2:
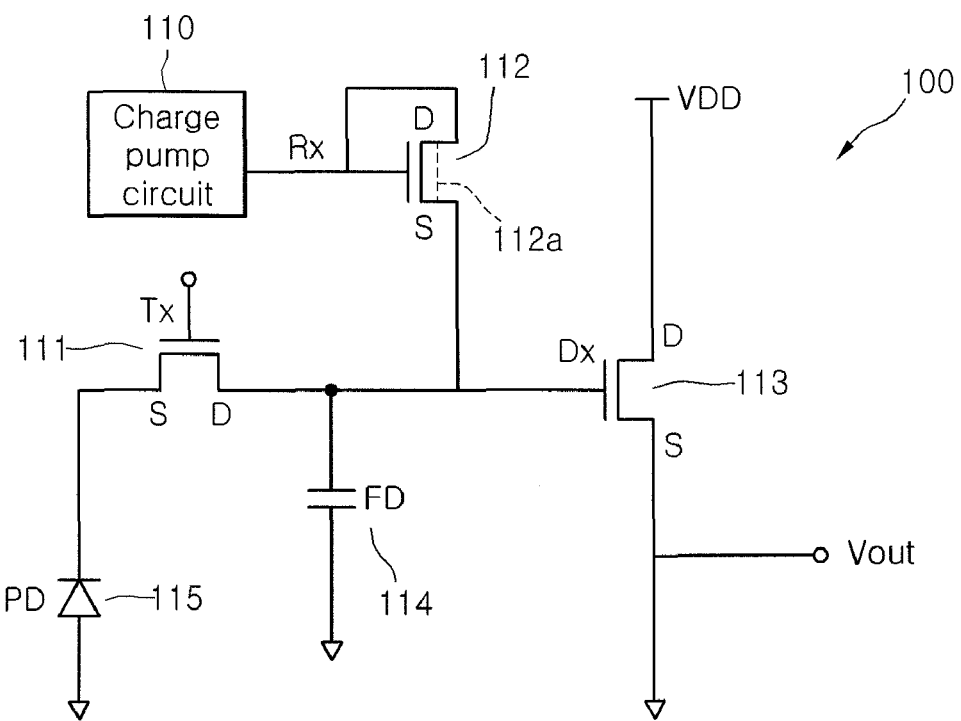

Example FIG. 2 illustrates an equivalent circuit diagram representing a unit pixel of an image sensor, in accordance with embodiments.

Figure 3:
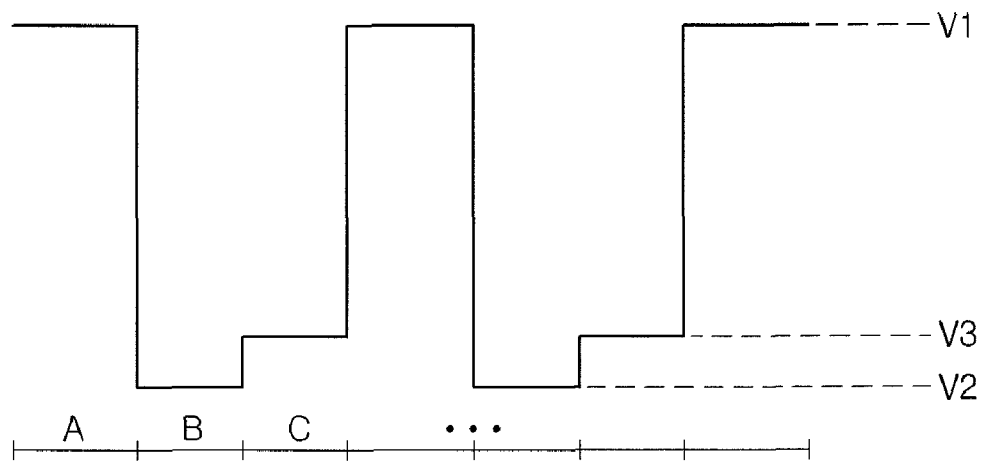

Example FIG. 3 illustrates a timing diagram showing the waveforms of signals supplied to a reset transistor from a charge pump circuit, in accordance with embodiments.

Example FIGS. 4 to 7 illustrate circuit diagrams showing current flow in a unit pixel of the image sensor according to the signals of the charge pump circuit, in accordance with embodiments.

Figure 8:
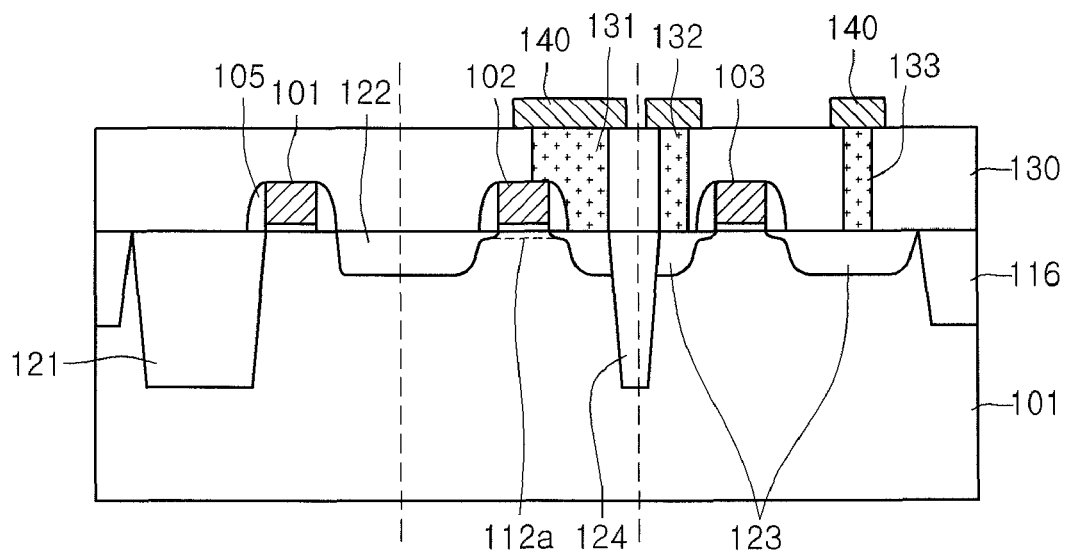

Example FIG. 8 illustrates a sectional view showing the unit pixel of the image sensor, in accordance with embodiments.

Figure 9:
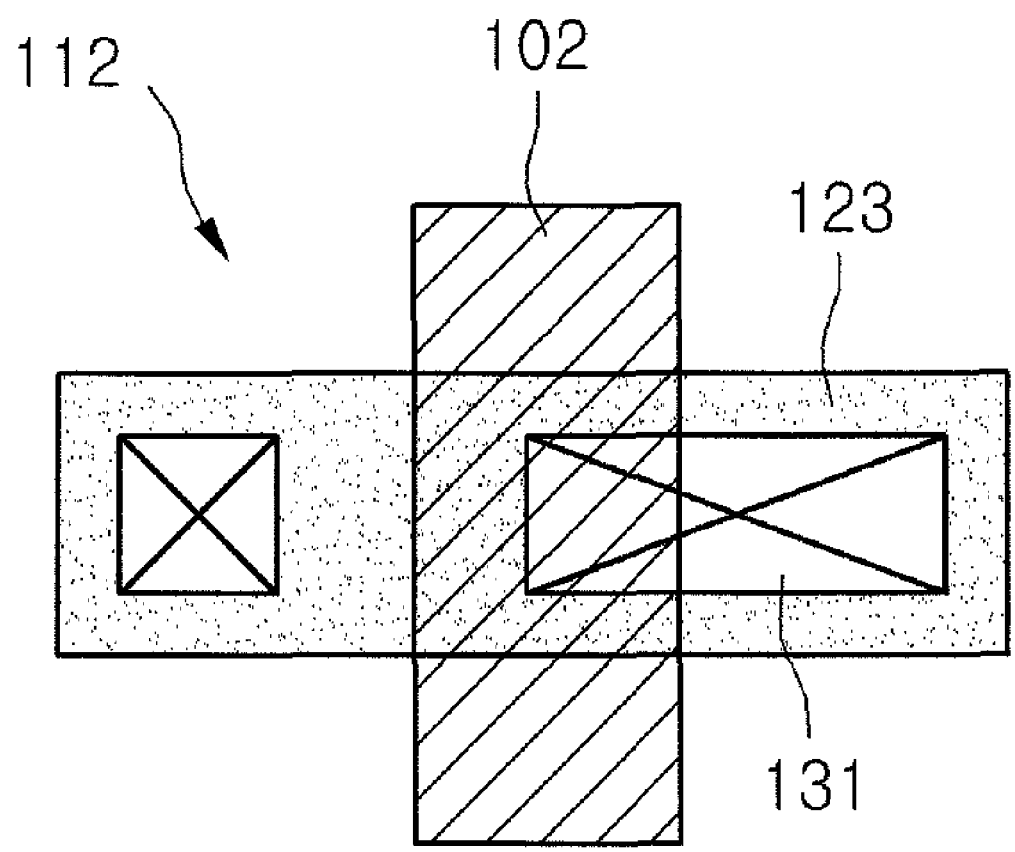

Example FIG. 9 illustrates a plan view showing the structure of the reset transistor, in accordance with embodiments.

DESCRIPTION

An image sensor in accordance with embodiments will be described in detail with reference to accompanying drawings.

In the description of embodiments, it will be understood that when a layer (or film) is referred to as being "on" another layer or substrate, it can be directly on another layer or substrate, or intervening layers may also be present. Further, it will be understood that when a layer is referred to as being "under" another layer, it can be directly under another layer, and one or more intervening layers may also be present. In addition, it will also be understood that when a layer is referred to as being "between" two layers, it can be the only layer between the two layers, or one or more intervening layers may also be present.

Meanwhile, an image sensor in accordance with embodiments is applicable to 3T, 4T and 5T-type structures according to the number of transistors. In addition, the image sensor in accordance with embodiments is applicable to the structure in which a plurality of unit pixels share a photodiode.

As illustrated in example FIG. 2, unit pixel 100 of an image sensor in accordance with embodiments includes charge pump circuit 110, photodiode (PD) 115, which is a photo detector, floating diffusion (FD) region 114, a first transistor serving as transfer transistor 111, a second transistor serving as a reset transistor 112 and a third transistor serving as a drive transistor 113. A source of transfer transistor 111 is connected to PD 115, and a drain of transfer transistor 111 is connected to FD region 114. A drain of reset transistor 112 is connected to a gate of reset transistor 112 to form a diode connection, and a source of reset transistor 112 is connected to FD region 114.

Charge pump circuit 110 is connected to the gate of reset transistor 112 to apply signals (first to third signals) V1, V2, and V3 as illustrated in example FIG. 3 having various levels to the gate of reset transistor 112. Drive transistor 113 acts as a source follower. A drain of drive transistor 113 is connected to power supply voltage terminal VDD, and a gate of drive transistor 113 is connected to FD region 114. A source of drive transistor 113 is connected to unit pixel output terminal Vout.

Example FIG. 3 is a timing diagram showing the waveforms of signals supplied to the reset transistor 112 from the charge pump circuit 110 in accordance with embodiments. Example FIGS. 4 to 7 are circuit diagrams showing current flow of a unit pixel of the image sensor according to the signals of the charge pump circuit 110 in accordance with embodiments.

In example FIGS. 4 to 7, the current flow is marked by using an arrow for the purpose of explanation.

Figure 4:
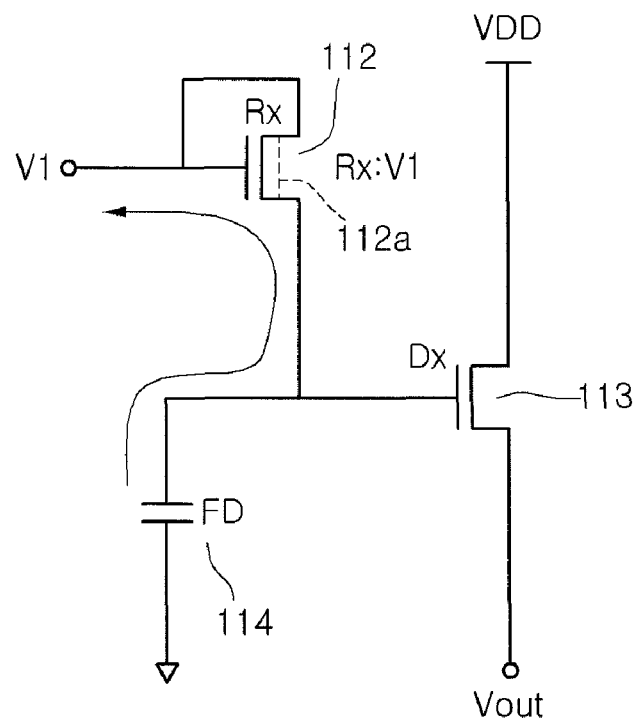

Hereinafter, the reset operation (a first operation) of FD region 114 will be described with reference to example FIGS. 3 and 4.

Charge pump circuit 110 supplies first signal V1 to the gate of reset transistor 112. First signal V1 serves as gate control signal Rx of reset transistor 112. A turn-off voltage is applied to the gate of transfer transistor 111 to serve as control signal Tx. If first signal V1 is applied to the gate of reset transistor 112, reset transistor 112 is turned on, and charges stored in FD region 114 are discharged to charge pump circuit 110 through reset transistor 112. In this case, first signal V1 may have a voltage value greater than a voltage value of power supply voltage terminal VDD. Since signals V1, V2, and V3 supplied from charge pump circuit 110 are greater than the voltage of charges discharged from FD region 114, charge pump circuit 110 is not affected by a signal supplying operation, and can act as a charge draining terminal.

For reference, the following structure may be obtained due to the diode connection of reset transistor 112. First, the drain and the gate of reset transistor 112 are connected to each other so that charges can be drained to charge pump circuit 110. Second, a general select transistor may be removed. Third, there may be provided a basic mechanism related to first signal V1, a reset operation according to first signal V1, the supply of the second and third signals, the output of a reset signal according to the first and third signals, the storage of photocharges, and the output of a signal Vsign (to be described below). During the reset operation, transfer transistor 111 is in a turn-off state. At this time, PD 115 generates photocharges.

In addition, turn-on voltage Vt_r of reset transistor 112 is applied to a gate of drive transistor 113 as control signal Dx, and drive transistor 113 may be maintained in a turn-off state. To this end, turn-on voltage Vt_d of drive transistor 113 is designed to be greater than turn-on voltage Vt_r of reset transistor 112. In other words, as illustrated in example FIG. 3, for duration A, reset transistor 112 is turned on, and the transistor and drive transistors 111 and 113 are in a turn-off state.

As described above, reset transistor 112 drains charges stored in FD region 114 to detect a signal, and applies control signal Dx to drive transistor 113. In addition, transfer transistor 111 transfers photocharges generated from PD 115 to FD region 114, and forms a source-drain path between PD 115 and FD region 114 to receive control signal Tx through the gate thereof.

Figure 5:
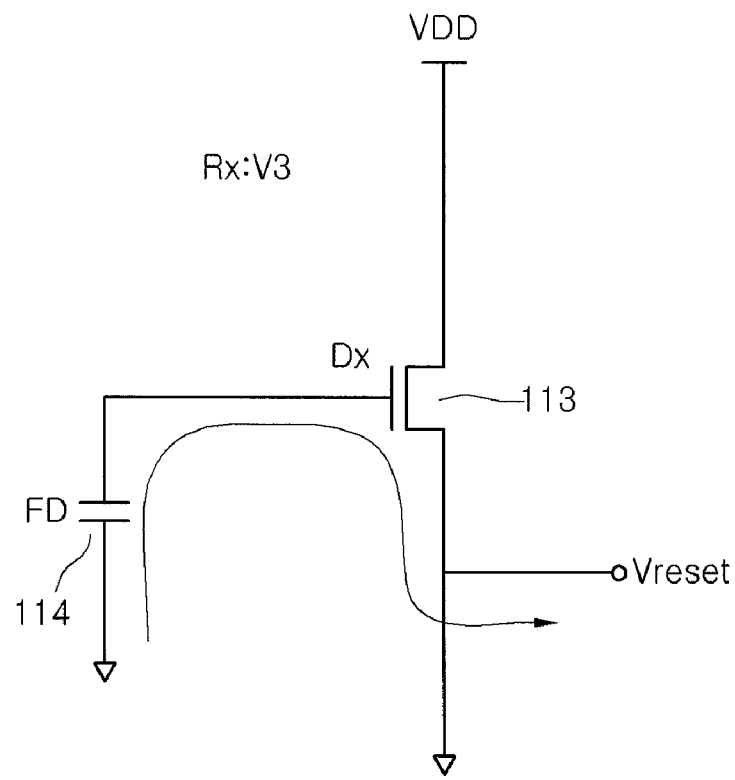

Hereinafter, an operation (second operation), in which a reset signal is output through drive transistor 113, will be described with reference to example FIGS. 3 and 5.

After the reset operation has been performed, charge pump circuit 110 supplies second signal V2 to the gate of reset transistor 112. Similarly to first signal V1, second signal V2 acts as gate control signal Rx of reset transistor 112. Second signal V2 has a voltage lower than that of first signal V1. The gate of transfer transistor 111 receives a turn-off voltage as control signal Tx. If second signal V2 is applied to the gate of reset transistor 112, reset transistor 112 is turned off, and the turn-off voltage of reset transistor 112 is applied as gate signal Dx of drive transistor 113. Accordingly, drive transistor 113 is turned on by power supply voltage of the drain thereof. Accordingly, reset signal Vreset of FD region 114 is output to unit pixel output terminal Vout through drive transistor 113.

Since the reset operation of FD region 114 has been performed, that is, charges stored in FD region 114 have been discharged to charge pump circuit 110 through reset transistor 112 in the first step, reset signal Vreset output to unit pixel output terminal Vout has a level of about 0V. Therefore, an external control circuit connected with unit pixel output terminal Vout can determine that reset operation of FD region 114 has been performed in the prior step (the first step) if reset signal Vreset having about 0V level is detected. Meanwhile, transfer transistor 111 is maintained in a turn-off state for the duration at which reset signal Vreset is output. For this duration, PD 115 can generate photocharges. In other words, as illustrated in example FIG. 3, for the duration of B, reset transistor 112 and transfer transistor 111 are in a turn-off state, and drive transistor 113 is in a turn-on state.

As described above, for duration in which the reset operation (duration of A) and the signal output operation (duration of B) are performed, the photocharges can be generated from PD 115.

Figure 6:
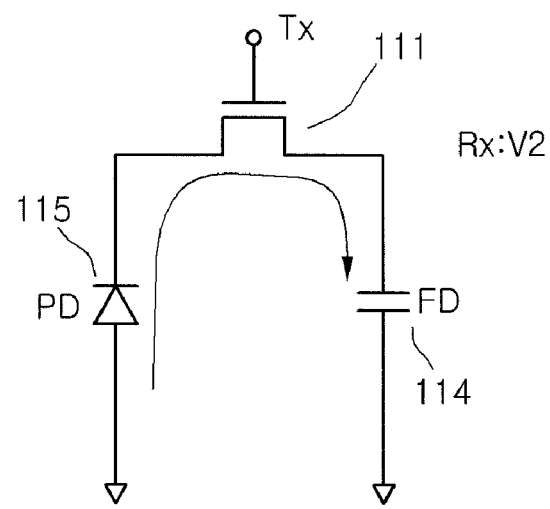

Hereinafter, an operation (a third operation), in which the photocharges generated from PD 115 are stored in FD region 114, will be described with reference to example FIGS. 3 and 6.

After reset signal Vreset has been output, charge pump circuit 110 supplies third signal V3 to the gate of reset transistor 112. Third signal V3 acts as gate control signal Rx of reset transistor 112. Third signal V3 has a voltage lower than that of first signal V1, and higher than that of second signal V2. The turn-on voltage is applied to the gate of transfer transistor 111 as control signal Tx. Accordingly, transfer transistor 111 is turned on, so that the photocharges generated from PD 115 are stored as signal Vsignal as illustrated in example FIG. 7 in FD region 113. A signal generated from reset transistor 112 according to third signal V3 is applied to the gate of drive transistor 113 as control signal Dx, so that drive transistor 113 is turned off In other words, as illustrated in example FIG. 3, for the duration of C, reset transistor 112 and drive transistor 113 are in a turn-off state, and transfer transistor 111 is in a turn-on state.

Figure 7:
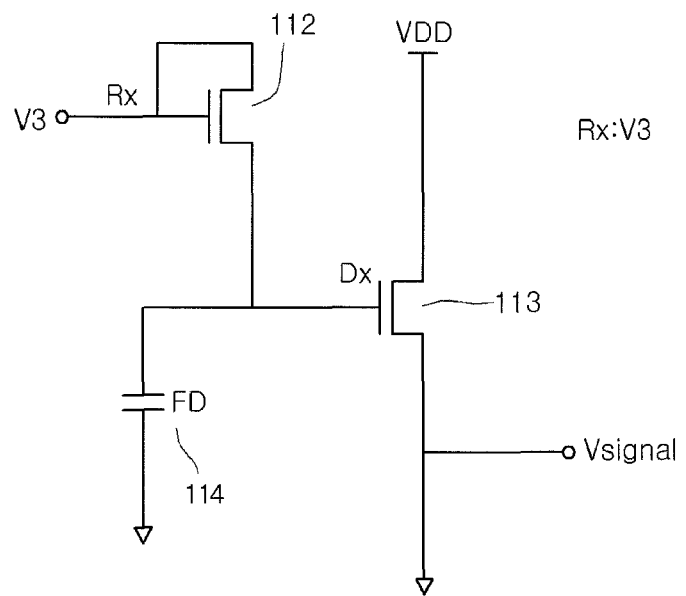

Hereinafter, an operation (a fourth operation), in which signal Vsignal is output through drive transistor 113, will be described with reference to example FIGS. 3 and 7.

After the photocharges have been stored in FD region 114, charge pump circuit 110 continuously supplies third signal V3 to the gate of reset transistor 112. In other words, the operation of outputting signal Vsignal is performed for the duration of C as illustrated in example FIG. 3, and the turn-off voltage is applied to the gate of transfer transistor 111 as control signal Tx. Therefore, in order to output an appropriate signal of a unit pixel, transfer transistor 111 is turned off, and reset transistor 112 is maintained in a turn-off state due to third signal V3. In addition, the turn-off voltage of reset transistor 112 is applied to drive transistor 113 as the gate signal Dx, and drive transistor 113 is turned on by power supply voltage VDD of the drain thereof Therefore, signal Vsignal stored in FD region 114 is output to unit pixel output terminal Vout through drive transistor 113. In other words, for the second half duration of C illustrated in example FIG. 3, reset transistor 112 and transfer transistor 111 are in a turn-off state, and drive transistor 113 is in a turn-on state.

When reset signal Vrest or the signal Vsignal is output from one image sensor among a plurality of image sensors provided in the form of a matrix and including a unit pixel, drive transistor 113 of an image sensor, which shares a column line with the above image sensor of outputting the signals and is connected to another row line, must be maintained in an off state. Therefore, the voltage of FD region 114 must be lower than threshold voltage Vt_d of drive transistor 113. In other words, an image sensor, in which drive transistor 113 is maintained in the turn-off state, performs the first and third operations. Accordingly, the turn-off voltage of reset transistor 112 may be lower than 0V through a negative charge pump.

In addition, for example, the turn-off operation of drive transistor 113 can be controlled by adjusting gate control signal Rx of reset transistor 112. In detail, gate control signal Rx of reset transistor 112 is adjusted to turn off drive transistor 113 when the voltage of FD region 114 is in the range of about 0.2V to about 0.3V in a state in which threshold voltage Vt_r of reset transistor 112 is maintained in the range of about 0V to about 0.1 V while maintaining the threshold voltage of drive transistor 113 in the range of about 0.5 V to 0.6 V. In this case, reset transistor 112 is turned on, so that the voltage of FD region 114 may be a required level. At this time, a counter-doping process is employed, so that reset transistor 112 having a lower threshold voltage can be realized.

As described above, for an image sensor in accordance with embodiments, the above four operations can be performed by using three transistors except for the select transistor, the three signals of charge pump circuit 110, and the three operation durations according to the three signals. In other words, drive transistor 113 performs the function of the select transistor.

Example FIG. 8 is a sectional view showing a unit pixel of the image sensor in accordance with embodiments, and example FIG. 9 is a plan view showing the structure of reset transistor 112 in accordance with embodiments.

As illustrated in example FIGS. 8 and 9, field oxide layer 116, which is an isolation layer, is formed at a predetermined region of semiconductor substrate 101. Accordingly, an active region scheduled as a unit pixel is defined by field oxide layer 116. Transfer gate 101, reset gate 102, and drive gate 103 are provided at a predetermined interval in an upper portion of the active region, and spacers 105 are provided at both sidewalls of each gate. FD region 122 is formed in the active region provided at one side of transfer gate 101, and PD region 121 is formed in an exposed active region provided at an opposite side of transfer gate 101. FD region 122 may be spatially aligned in-line with an edge of spacer 105 provided at a sidewall of transfer gate 101 while PD region 121 may be spatially aligned in-line with an edge of transfer gate 101.

PD region 121 may have a vertical PN junction structure including a shallow region doped with P-type impurities and a deep region doped with N-type impurities. One side of reset gate 102 is connected to FD region 122, and an opposite side of reset gate 101 is separated from drive gate 103 by isolation layer 124. A region heavily doped with N-type impurities may be formed in at least one side of each of reset gate 102 and drive gate 103, thereby forming source and drain region 123.

In reset transistor 112, reset gate 102 comes into direct contact with the drain including the region heavily doped with N-type impurities by first contact electrode 131. Accordingly, a diode contact is formed. In reset transistor 112, counter doping region 112a may be formed in a channel below reset gate 102 such that a threshold voltage can be adjusted. Counter doping region 112a is formed by implanting N-type impurities or P-type impurities. If reset transistor 112 is an NMOS transistor, counter doping region 112a may be formed by implanting N-type impurities. The doping density of counter doping region 112a varies depending on the design of the transistors. In particular, the transistors may be designed by taking the relation between a power supply voltage and a threshold voltage of drive transistor 113 into consideration.

A drain formed by the region heavily doped with N-type impurities at one side of drive gate 103 is connected to second contact electrode 132 such that the drain can be connected to power supply voltage terminal VDD. A source formed by the region heavily doped with N-type impurities at the opposite side of drive gate 103 is connected to third contact electrode 133 such that the source can be connected to unit pixel output terminal Vout. First contact electrode 131, second contact electrode 132 and third contact electrode 133 are connected to first metallic lines 140 formed on and/or over insulating layer 130 which cover the transistors.

As illustrated in example FIG. 9, in reset transistor 112, first contact electrode 131 is connected to both a portion of a top surface of reset gate 102 and a portion of the drain at an upper portion of the channel. The structure of reset transistor 112 and first contact electrode 131 may vary depending on the layout of the image sensor. A gate signal of reset transistor 112 is applied to charge pump circuit 110, that is, at least one of positive and negative charge pumps, and a power supply voltage line connected to the drain of drive transistor 113 may be separated from reset transistor 112. In other words, first contact electrode 131 is separated from second contact electrode 132 by isolation layer 124, and the power supply voltage line connected to second contact electrode 132 may be laid-out without passing through reset transistor 112, so that a metal routing can be reduced. Accordingly, when a semiconductor of the image sensor is designed, the layout of the image sensor can be simplified, and the fill factor of PD 114 can be increased.

In accordance with embodiments, a 3T-type image sensor can be realized by removing a select transistor from a 4T-type image sensor, so that the manufacturing process can be simplified, and a metal routing can be reduced, overall manufacturing costs can be reduced, which in turn, simplifies the manufacturing process.

In accordance with embodiments, a light receiving region is increased by ensuring a region in which the select transistor has been removed in the image sensor, thereby enhancing the fill factor and simplifying the layout of a unit pixel.

In accordance with embodiments, the drain and the gate of reset transistor 112 of the image sensor are diode-connected to each other, thereby expanding the function of reset transistor 112, so that the operation of drive transistor 113 can be simply controlled.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. An apparatus comprising:
   a charge pump circuit which supplies a plurality of signals including a first signal a second signal and a third signal, each signal having sequentially decreasing voltage levels;
   a reset transistor having a drain and a gate connected with the charge pump circuit to form a diode connection and which receives the plurality of signals;
   a photodiode which generates photocharges;
   a transfer transistor which forms a series connection between the photodiode and the reset transistor;
   a floating diffusion region which forms a parallel connection between the transfer transistor and the reset transistor and which stores the photocharges; and
   a drive transistor connected with the floating diffusion region, the reset transistor, a power supply voltage terminal and a unit pixel output terminal, wherein a gate of the transfer transistor receives a turn-off voltage if the first or second signal is supplied, and receives one of a turn-off voltage and a turn-on voltage if the third signal is supplied.

2. The apparatus of claim 1, wherein:
a source of the transfer transistor is connected with the photodiode,
a drain of the transfer transistor is connected with the floating diffusion region and a source of the reset transistor,
a gate of the driver transistor is connected to the source of the reset transistor,
a source of the drive transistor is connected with the unit pixel output terminal, and
a drain of the drive transistor is connected with the power supply voltage terminal.

3. The apparatus of claim 1, wherein:
the plurality of signals are sequentially supplied,
the plurality of signals are repeatedly supplied in a form of a group,
a gate of the transfer transistor receives a turn-off voltage if one of the first signal and the second signal is supplied, and
the gate of the transfer transistor receives a turn-off voltage after receiving a turn-on voltage if the third signal is supplied.

4. The apparatus of claim 1, wherein if the first signal is supplied to the gate of the reset transistor, and the turn-off voltage is applied to a gate of the transfer transistor, the reset transistor is turned on, the transfer transistor is turned off, a turn-on voltage of the reset transistor is applied to a gate of the drive transistor to turn off the drive transistor, and the photocharges of the floating diffusion region are discharged to the charge pump circuit through the reset transistor, so that a reset operation is performed.

5. The apparatus of claim 4, wherein the first signal has a voltage value greater than a voltage value of the power supply voltage terminal.

6. The apparatus of claim 4, wherein a turn-on voltage of the drive transistor is higher than the turn-on voltage of the reset transistor.

7. The apparatus of claim 4, wherein photocharges are generated from the photodiode if the transfer transistor is turned off.

8. The apparatus of claim 1, wherein, if the second signal is supplied to the gate of the reset transistor, and the turn-off voltage is applied to a gate of the transfer transistor, the reset transistor is turned off, the driving transistor is turned on as a turn-off voltage of the reset transistor is applied to a gate of the driving transistor, and a reset signal of the floating diffusion region is output to the unit pixel output terminal through the drive transistor.

9. The apparatus of claim 8, wherein photocharges are generated from the photodiode if the transfer transistor is turned off.

10. The apparatus of claim 1, wherein, if the third signal is supplied to the gate of the reset transistor, and the turn-on voltage is applied to a gate of the transfer transistor, the reset transistor is turned off, the drive transistor is turned off, the transfer transistor is turned on, and photocharges of the photodiode are stored in the floating diffusion region as a signal.

11. The apparatus of claim 1, wherein, if the third signal is supplied to the gate of the reset transistor, and the turn-off voltage is applied to a gate of the transfer transistor, the transfer transistor is turned off, the reset transistor is turned off, a turn-off voltage of the reset transistor is applied to a gate of the drive transistor to turn on the drive transistor, a signal of the floating diffusion region is output to the unit pixel output terminal through the drive transistor.

12. The apparatus of claim 1, wherein a voltage of the floating diffusion region is lower than a threshold voltage of the drive transistor if the drive transistor is maintained in an off state.

13. The apparatus of claim 12, wherein a turn-off voltage of the reset transistor, which corresponds to the second and third signals, is applied lower than 0V using a negative charge pump.

14. The apparatus of claim 12, wherein the first signal and the third signal, which serve as a gate signal of the reset transistor, are adjusted to turn off the drive transistor when a threshold voltage of the drive transistor is in a range of 0V to 0.1V, a threshold voltage of the drive transistor is in a range of about 0.5V to about 0.6V, and a voltage of the floating diffusion region is in a range of about 0.2 to about 0.3V.

15. The apparatus of claim 1, wherein a channel region of the reset transistor is counter-doped so that a threshold voltage of the reset transistor is maintained to a low value.

16. The apparatus of claim 1, wherein the reset transistor has a threshold voltage lower than a threshold voltage of the drive transistor.

17. The apparatus of claim 1, further comprising:
a field oxide layer formed over a silicon substrate and an active region defined by the field oxide layer;
a transfer gate, a reset gate and a drive gate formed in the active region, wherein the photodiode is formed at one side of the transfer gate and the floating diffusion region formed between an opposite side of the transfer gate and one side of the reset gate;
a first drain formed adjacent to an opposite side of the reset gate;
a second drain formed adjacent to one side of the drive gate;
a source formed adjacent to an opposite side of the drive gate;
an isolation layer formed between the first drain adjacent to the reset gate and the second drain adjacent to the drive gate;
an insulating layer formed over the silicon substrate; and
a first contact electrode formed in the insulating layer and simultaneously connected to the reset gate and the drain of the reset gate to form a diode connection.

18. The apparatus of claim 17, further comprising:
a second contact electrode formed in the insulating layer and connected to the second drain adjacent to the drive gate to form the power supply voltage terminal; and
a third contact electrode formed in the insulating layer and connected to the source adjacent to the drive gate to form the unit pixel output terminal.

19. The apparatus of claim 17, further comprising a counter doping region formed in a channel region below the reset gate.

20. The apparatus of claim 17, wherein the first and second drains adjacent to the reset gate and the drive gate are spaced apart from each other by the isolation layer, so that the charge pump circuit is distinguished from a metal routing of the power supply voltage terminal, and the metal routing is reduced.

* * * * *